United States Patent [19]

Bishop

[11] Patent Number: 5,140,258

[45] Date of Patent: Aug. 18, 1992

[54] DISPOSABLE TAMPER DETECTION DEVICE FOR ELECTRICITY METERS

[75] Inventor: Roy Bishop, Welland, Canada

[73] Assignee: Micro-Port International Ltd., Welland, Canada

[21] Appl. No.: 629,613

[22] Filed: Dec. 18, 1990

[51] Int. Cl.⁵ .............................................. G01R 11/24
[52] U.S. Cl. .................................... 324/110; 340/568
[58] Field of Search ................ 324/110; 340/568, 637; 361/364, 369, 372, 374

[56] References Cited

U.S. PATENT DOCUMENTS

| | | | |
|---|---|---|---|
| 693,688 | 2/1902 | Claypoole | 324/110 |
| 999,196 | 8/1911 | Berardi | 324/110 |
| 4,039,943 | 8/1977 | Tapcott | 324/110 |
| 4,150,371 | 4/1979 | Scaglione | 324/110 |
| 4,386,313 | 5/1983 | Venaas et al. | 324/110 |
| 4,386,314 | 5/1983 | Becker | 324/110 |
| 4,588,949 | 5/1986 | Becker et al. | 340/568 |

FOREIGN PATENT DOCUMENTS 350881 3/1922 Fed. Rep. of Germany ...... 324/110

*Primary Examiner*—Ernest F. Karlsen
*Attorney, Agent, or Firm*—Marks & Clerk

[57] ABSTRACT

A disposable tamper detection device for electricity meters of the type having a meter housing with current-carrying blades protruding therefrom for insertion into a meter socket, comprises a non-conductive board-like member having a pair of slots adapted to fit over a pair of respective protruding current-carrying blades so as to bridge them. Terminals establish contact with the pair of protruding blades. A fuse and current limiting device are connected in series between the terminals. The current limiting device limits the current flow through the fuse to a sufficiently low level to prevent the fuse from blowing under normal conditions. A switch, spring biased into the closed position, is connected in parallel with the current limiting device. The switch means has a retainer adapted to be engaged by the meter when fully inserted into its socket to retain the switch in the open position against the spring bias. A releasable retainer for retains the switch in the normally open position during insertion of the meter into its receiving socket and releases the switch means after such insertion. Upon partial removal of the meter from its receiving socket the switch means closes under its spring bias, thereby blowing said fuse and establishing a record of the partial removal of the meter from its receiving socket.

7 Claims, 2 Drawing Sheets

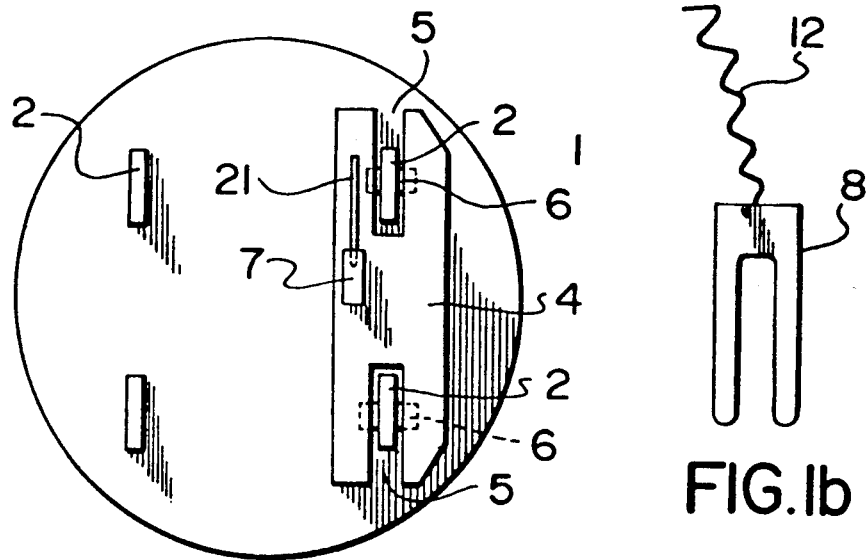
FIG.1a
FIG.1b
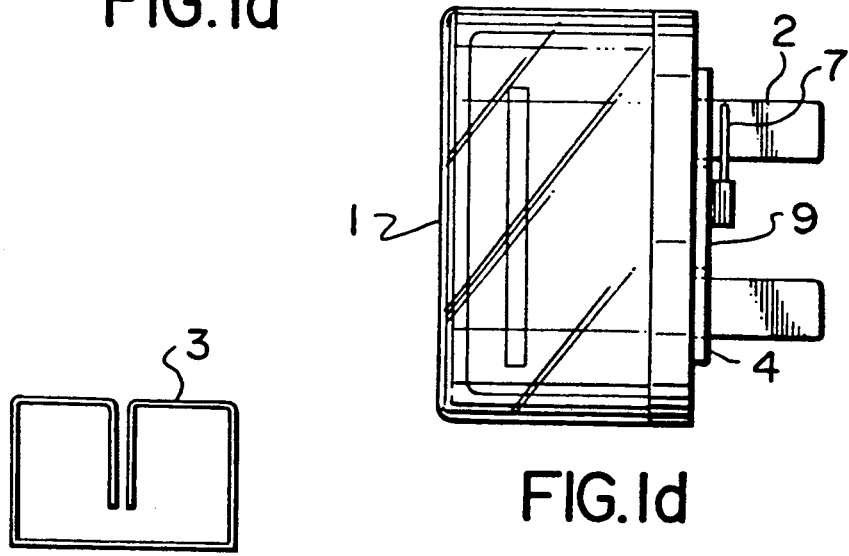
FIG.1c
FIG.1d

DISPOSABLE TAMPER DETECTION DEVICE FOR ELECTRICITY METERS

BACKGROUND OF THE INVENTION

The invention relates to utility meters, more particularly to a device for detecting tampering of electricity meters of the type having a meter with current-carrying blades protruding therefrom for insertion into a meter socket.

In North America, power theft is a major problem. Conventional blade type electricity meters can be easily removed from their socket and either bypassed altogether or in some cases reversed so that the meter count decreases. It is known to apply metal seals, but the tools for applying such seals can be regularly obtained on the black market, and generally a determined thief can easily defeat such a system.

There is a need for a low cost device that enables the utility company to establish with certainty that meter tampering has taken place so that appropriate measure can be taken. In view of the very large number of electricity meters in use, such a device must be of low cost and easy to retrofit.

An object of the invention therefore is to provide such a device capable of alleviating the problems currently experienced in the prior art.

SUMMARY OF THE INVENTION

According to the present invention there is provided a disposable tamper detection device for electricity meters of the type having a meter housing with current-carrying blades protruding therefrom for insertion into a meter socket, comprising a non-conductive board-like member having a pair of slots adapted to fit over a pair of respective protruding current-carrying blades so as to bridge said pair of protruding blades; terminals for establishing contact with said pair of protruding blades; fuse means and current limiting means connected in series between said terminals, said current limiting means limiting the current flow through said fuse to a sufficiently low level to prevent said fuse means from blowing under normal conditions; switch means spring biased into the closed position in parallel with said current limiting means, said switch means having retaining means adapted to be engaged by the meter when fully inserted into its socket to retain said switch means in the open position against said spring bias; and releasable retaining means for retaining said switch means in the normally open position during insertion of the meter into its receiving socket and releasing said switch means after such insertion, whereby upon partial removal of the meter from its receiving socket said switch means closes under its spring bias thereby blowing said fuse and establishing a record of said partial removal of the meter from its receiving socket.

In the preferred embodiment, the board-like member is a printed circuit board carrying the components. The releasable means is a cord which hangs down in such a way that it can be pulled to release a lug when the meter has been firmly put in place. Subsequent removal of the meter causes the switch to close under the action of its spring bias, thereby blowing the fuse. In addition, there is preferably an audible alarm or radio transmitter that is activated when the fuse is blown. The whole device is powered by the main power supply.

The fuse means can be in the form of a LED that blows when excess current passes through it.

A remotely activated switch can be placed in series with the fuse so that when opened, blowing of the fuse will be simulated. This arrangement permits periodic testing of the device by a meter reader.

BRIEF DESCRIPTION OF THE DRAWINGS

The invention will now be described in more detail, by way of example only, with reference to the accompanying drawings, in which:

FIG. 1a is an underneath view of an electricity meter with a device in accordance with the invention fitted over two of its protruding blades;

FIG. 1b is a side view of a retaining clip used during installation of the device;

FIG. 1c is a diagrammatic view of the jaws on the meter base for receiving the protruding blades of the meter;

FIG. 1d is a side view of an electricity meter; and

DESCRIPTION OF THE PREFERRED EMBODIMENTS

Figure 2A:
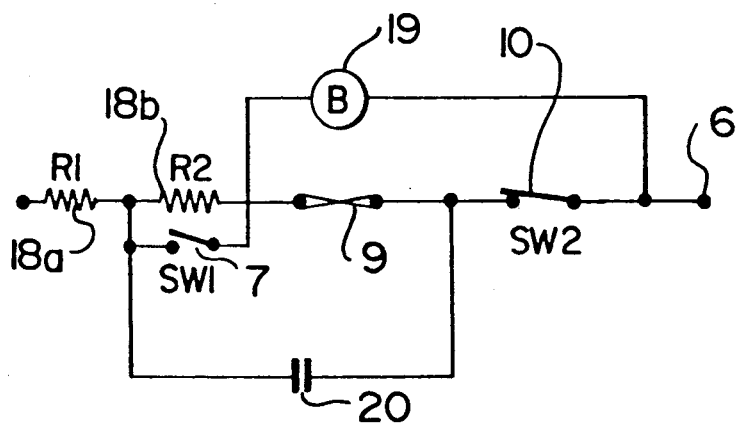
FIGS. 2a to 2c show different configurations of the circuit of the tamper detection device.

A conventional North American domestic electricity meter housing 1 containing the eddy current and meters dials within a glass case has four protruding pins 2 on its underside. In the inserted position the pins 2 are received by spring jaws 3 (FIG. 1c of a conventional meter socket). The electricity meter could be for example a conventional Sangamo meter.

The tamper detection device comprises a generally rectangular strip of printed circuit board 4 with outwardly directed opposed slots 5 in its ends. The printed circuit board 4 fits snugly over the protruding blades 2 of the meter. Terminals 6 establish contact with the blades 2.

On the printed circuit board 4 is mounted a switch 7 with a protruding arm 21 the switch 7 normally being spring biased into the closed position. The switch 7 can be held in the open position by means of the displaceable arm 21 which engages between the meter housing 1 and meter base. When the housing 1 is inserted fully into the socket, the socket engages the arm 21 of the switch which is displaced to hold the switch in its open position.

Figure 2B:
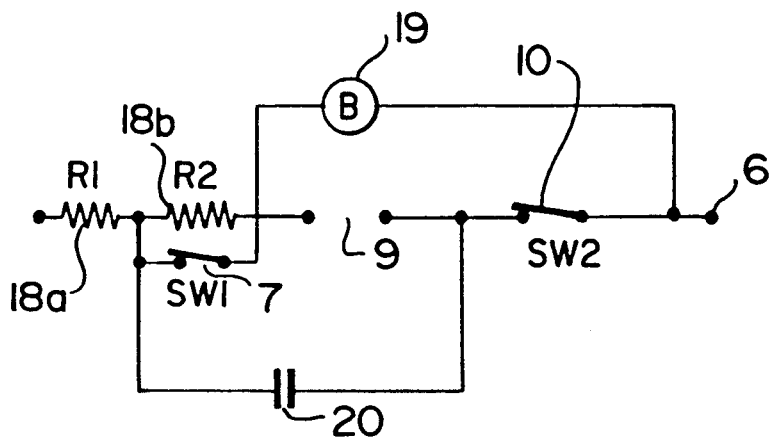
Figure 2C:
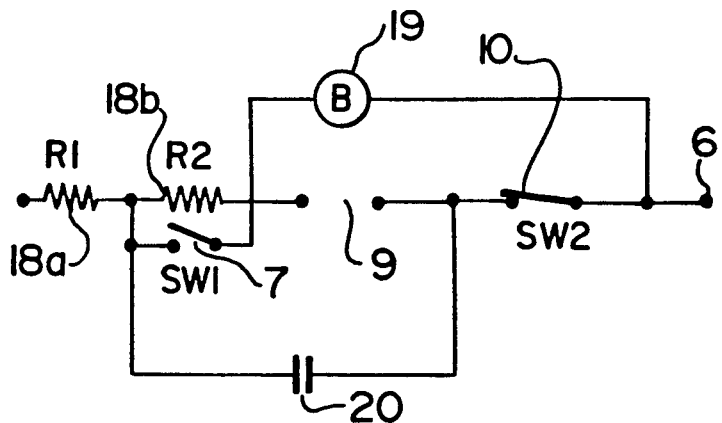

As shown in FIGS. 2a to 2c, the tamper detection device comprises current limiting means 18 comprising series resistors 18a and 18b in series with fuse 9 and second normally closed switch 10. An audible alarm, such as a buzzer, is arranged in parallel with the fuse 9 and switch 10.

In normal operation the switch 7 is held open by virtue of its being clamped between the meter housing 1 and the base. The current limiting means, consisting of resistors 18a, 18b, has a value such that the fuse 9 will not blow when the main supply voltage is supplied to terminals 6. If partial removal of the meter is attempted, the switch 7 is no longer clamped between the meter housing 1 and the meter base, and as a result the switch 7 moves under the action of spring bias into its closed position, thereby increasing the current through the fuse 9 to a level where the fuse blows. Thereafter, the full mains voltage is applied across the buzzer B, which is thereby activated.

During insertion of the meter housing 1 into its socket, the switch 7 is held in the closed position by a retainer clip 8 that temporarily holds the arm 21 in the closed position against the action of the spring 6 bias. The clip 8 is attached to a cord 12 that hangs down outside the meter. As the meter housing 1 is rammed home, the person inserting the meter then pulls on the cord to release the retainer clip 8, thereby ensuring that the switch 7 remains closed by virtue of the fact that it is trapped between the meter housing 1 and its receiving socket or base.

Capacitor 20 acts as a safety device in the event that the switch 7 does not close when the meter housing 1 is withdrawn from the meter base.

The effect of the fuse 9 blowing can be simulated for test purposes by opening switch 10. This can either be a motion sensitive or magnetically operated reed switch, such that tapping the meter or bringing a magnet into its proximity will open the switch, thereby simulating blowing of the fuse and causing the full main supply voltage to be applied across the buzzer B, which will thereby be temporarily activated.

The described device has the advantage of simplicity and effectiveness. It is an inexpensive throw-away device that can be mass produced at very low cost, and yet it provides an almost certain way of establishing that meter tampering has taken place. The fuse can only blow when an attempt is made to remove the meter.

In the case of authorized removal, of course the service person merely replaces the tamper detection device by a new unit and discards the old unit.

I claim:

1. A disposable tamper detection device for electricity meters of the type having a meter housing with current-carrying blades protruding therefrom for insertion into a meter socket, said tamper detection device comprising:
   - a non-conductive board-like member adapted to be fitted onto the meter housing so as to bridge a pair of protruding current-carrying blades, said board-like member having a pair of opposed slots for accommodating the respective protruding current-carrying blades;
   - terminals on said board-like member for establishing contact with said pair of protruding blades when said board-like member is fitted on the meter housing;
   - a series combination of fuse means and current limiting means connected between said terminals, said current limiting means limiting the current flow through said fuse means to a sufficiently low level to prevent said fuse means from blowing under normal operating conditions;
   - an audible alarm in parallel with said fuse means and operable when full line voltage is applied thereto as a result of said fuse means blowing and forming an open circuit across said audible alarm;
   - switch means spring biased into the closed position in parallel with said current limiting means, said switch means having means adapted to be engaged by the meter when fully inserted into its socket to retain said switch means in the open position against the action of said spring bias; and
   - temporary retaining means for retaining said switch means in the open position during insertion of the meter into its receiving socket and being removable after such insertion;
   - whereby upon partial removal of the meter from its receiving socket said switch means closes under the action of the spring bias thereby blowing said fuse means to establish a record of said parallel removal of the meter from its receiving socket and to apply full line voltage to said audible alarm.

2. A disposable tamper detection device for electricity meters as claimed in claim 1 wherein said releasable means comprises a cord attached to a retaining clip, which cord when pulled displaces said clip and releases said switch means.

3. A disposable tamper detection device for electricity meters as claimed in claim 1 further comprising an audible alarm in parallel with said fuse that is activated when said fuse blows as a result of the full line voltage thereby being applied to said alarm.

4. A disposable tamper detection device for electricity meters as claimed in claim 3 wherein said audible alarm comprises a buzzer.

5. A disposable tamper detection device for electricity meters as claimed in claim 1 further comprising a second remotely actuable normally closed switch means in series with said fuse for simulating blowing of said fuse to permit temporary actuation of said audible alarm for test purposes.

6. A disposable tamper detection device for electricity meters as claimed in claim 5 wherein said remotely actuable switch means is a motion sensitive switch such that tapping of the meter will temporarily actuate said audible alarm.

7. A disposable tamper detection device for electricity meters as claimed in claim 5 wherein said remotely actuable switch means is magnetically actuable whereby the bringing of a magnet into proximity with the meter of the meter will temporarily actuate said audible alarm.

* * * * *